US012416078B2

(12) United States Patent
Choi et al.

(10) Patent No.: US 12,416,078 B2
(45) Date of Patent: Sep. 16, 2025

(54) JANUS TRANSITION METAL DICHALCOGENIDE THIN FILM AND METHOD OF FABRICATING THE SAME

(71) Applicant: UNIVERSITY-INDUSTRY COOPERATION GROUP OF KYUNG HEE UNIVERSITY, Yongin-si (KR)

(72) Inventors: Suk Ho Choi, Suwon-si (KR); Chan Wook Jang, Yongin-si (KR); Won Jun Lee, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 668 days.

(21) Appl. No.: 17/752,439

(22) Filed: May 24, 2022

(65) Prior Publication Data

US 2023/0151482 A1     May 18, 2023

(30) Foreign Application Priority Data

Nov. 16, 2021     (KR) .................. 10-2021-0157774

(51) Int. Cl.
| | | |
|---|---|---|
| C30B 25/18 | (2006.01) | |
| C23C 16/30 | (2006.01) | |
| C30B 29/46 | (2006.01) | |

(52) U.S. Cl.
CPC ............ C23C 16/305 (2013.01); C30B 25/18 (2013.01); C30B 29/46 (2013.01)

(58) Field of Classification Search
CPC ....... C23C 16/305; C30B 29/46; C30B 25/16; C30B 25/18; C30B 25/165; C30B 25/10
See application file for complete search history.

(56) References Cited

U.S. PATENT DOCUMENTS 5,217,923 A * 6/1993 Suguro ................. H10D 64/62
148/DIG. 147
2015/0303329 A1* 10/2015 Teraji .................... H10F 10/167
136/252

(Continued)

FOREIGN PATENT DOCUMENTS

| CN | 108707875 A | * | 10/2018 | ........... C23C 16/305 |
| CN | 109999849 A | * | 7/2019 | ........... B01J 27/057 |

(Continued)

OTHER PUBLICATIONS

English computer translation of CN-108707875-A (Year: 2025).*

(Continued)

*Primary Examiner* — Matthew J Song
(74) *Attorney, Agent, or Firm* — Sughrue Mion, PLLC

(57) ABSTRACT

Disclosed is a method of fabricating a Janus transition metal dichalcogenide thin film. More particularly, the method includes a first step of depositing a transition metal dichalcogenide thin film including a first chalcogen element on an oxide silicon substrate; a second step of a vacancy forming in the transition metal dichalcogenide thin film; and a third step of substituting the first chalcogen element with a second chalcogen element to form a Janus transition metal dichalcogenide thin film. The first step, the second step, and the third step may be performed in a single CVD process in a same reaction chamber.

Therefore, the present disclosure can shorten the processing time of a Janus transition metal dichalcogenide thin film and can reduce the manufacturing cost thereof. In addition, the present disclosure can minimize damage to the Janus transition metal dichalcogenide thin film during the fabrication process, thereby being capable of a high-quality single-crystal Janus transition metal dichalcogenide thin film.

10 Claims, 24 Drawing Sheets

(56) References Cited

U.S. PATENT DOCUMENTS

2020/0161176 A1* 5/2020 Wong ............... H01L 21/67115
2021/0189586 A1* 6/2021 Tongay .................. C01B 19/04
2021/0313576 A1* 10/2021 Choi .................. H01M 4/5815

FOREIGN PATENT DOCUMENTS

CN          113035942 A  *  6/2021  ........... C23C 16/305
KR   10-2017-0048873 A      5/2017

OTHER PUBLICATIONS

English computer translation of CN-109999849-A (Year: 2025).*
English computer translation of CN-113035942-A (Year: 2025).*
Office Action issued Sep. 15, 2023 in Korean Application No. 10-2021-0157774.
Yunfan Guo, et al. "Designing artificial two-dimensional landscapes via atomic-layer substitution", PNAS, 2021, vol. 118, No. 32, pp. 1-7.
Shudong Zhao, et al., "Large-area synthesis of monolayer MoTexSe2-x alloys by chemical vapor deposition", Appl. Phys. Lett, 2019, vol. 115, No. 063105 (5 pages).
Weigang Lu, et al., "Defect engineering on $MoS_2$ surface with argon ion bombardments and thermal annealing", Applied Surface Science, 2020, vol. 532, No. 147461 (7 pages).

* cited by examiner

[FIG. 1]
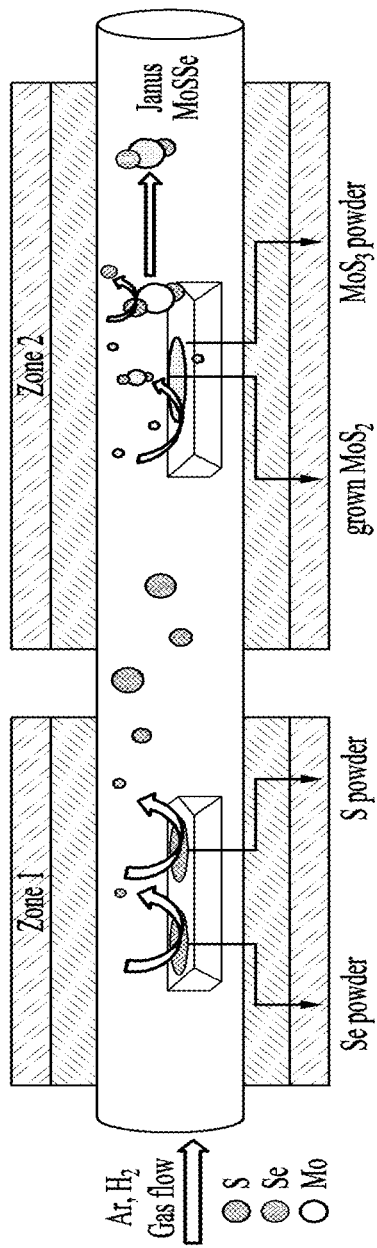

[FIG. 2]
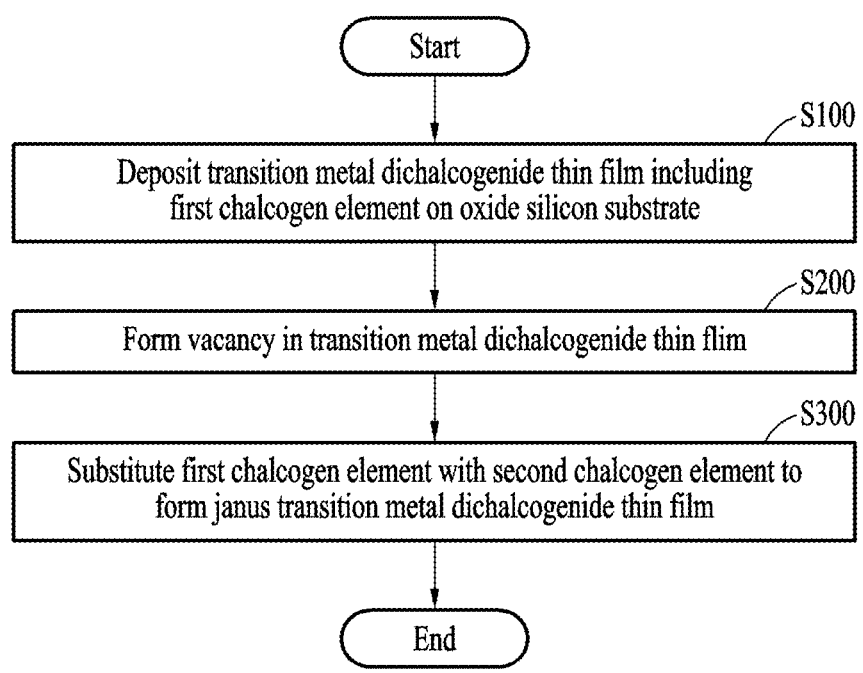

[FIG. 3]
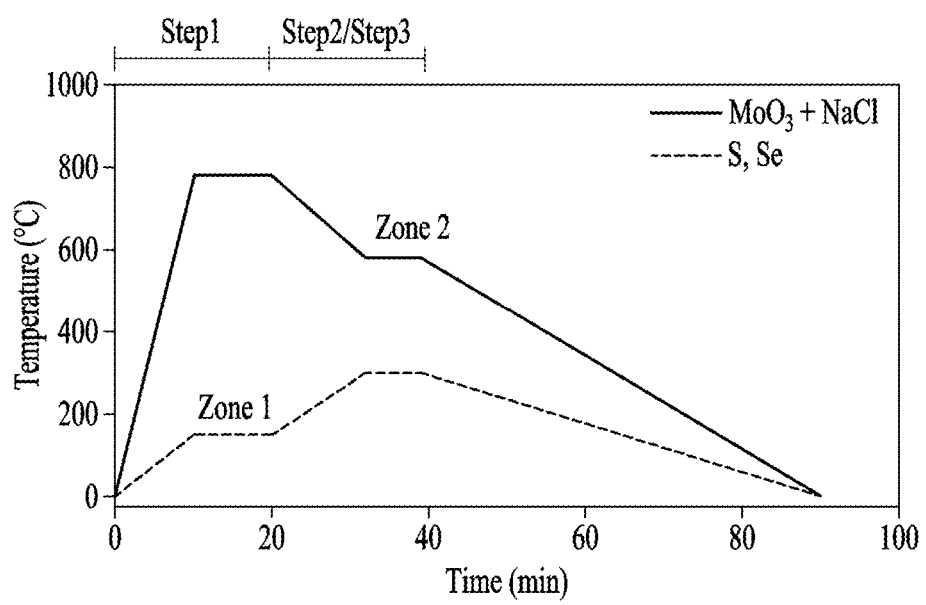

[FIG. 4]
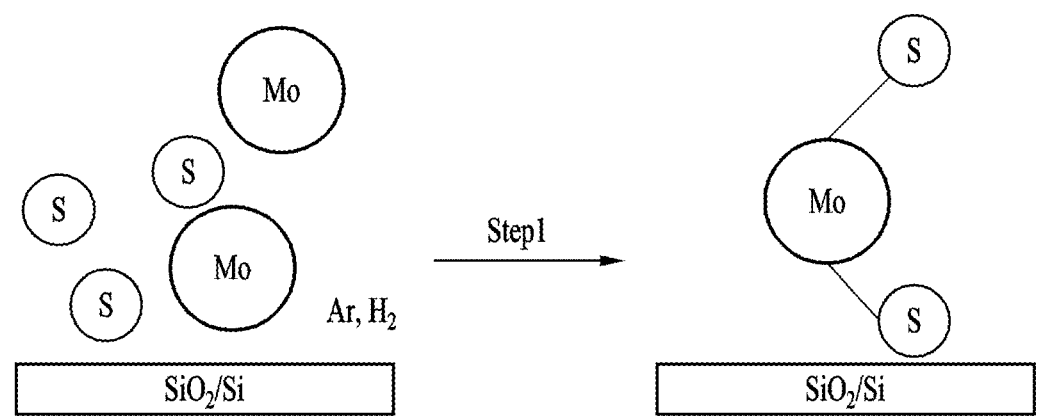

[FIG. 5]
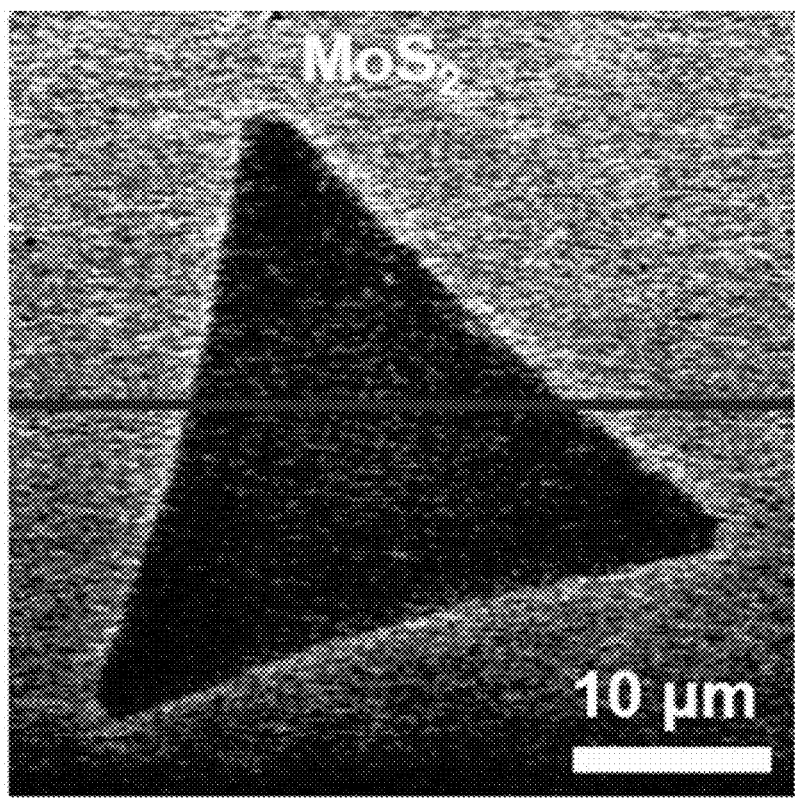
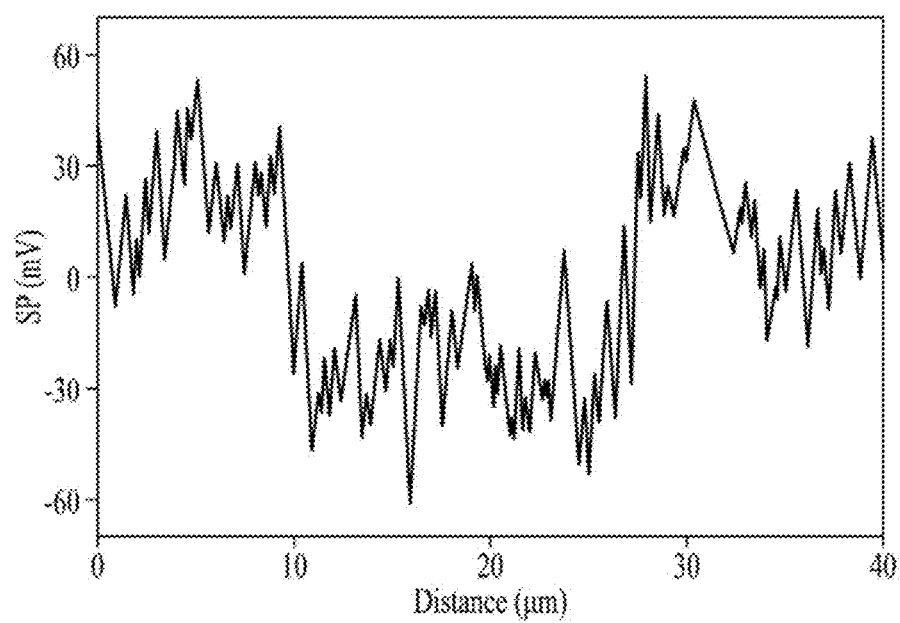

[FIG. 6]
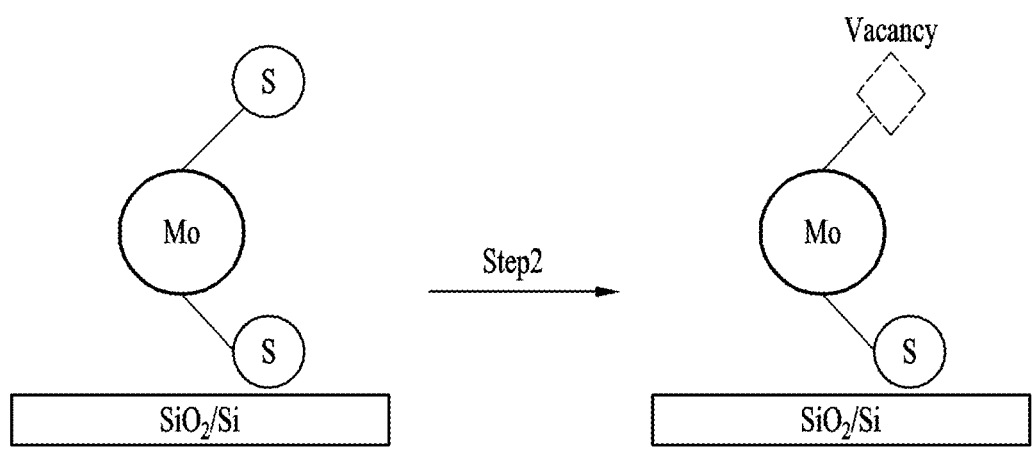

[FIG. 7A]
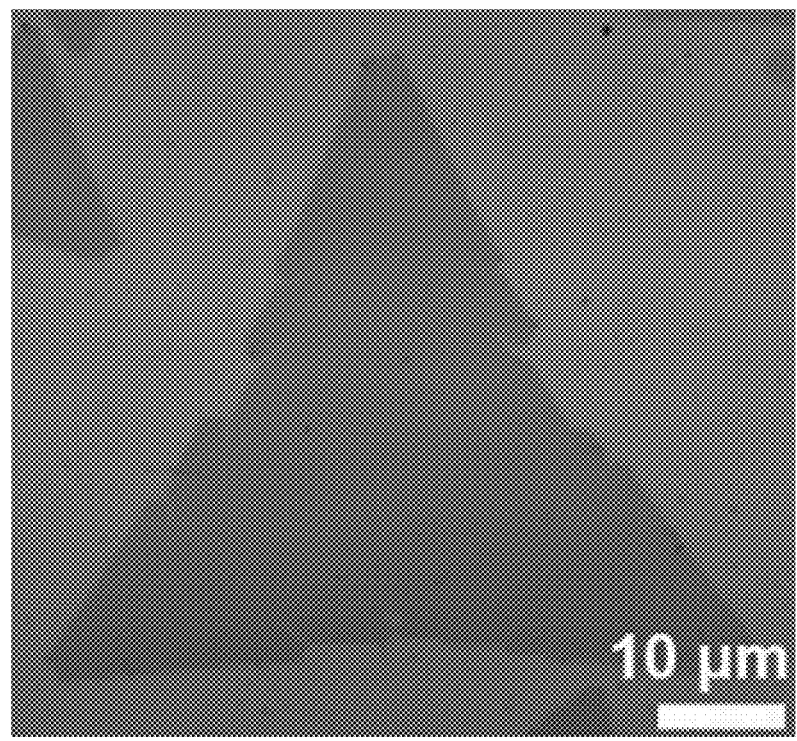

[FIG. 7B]
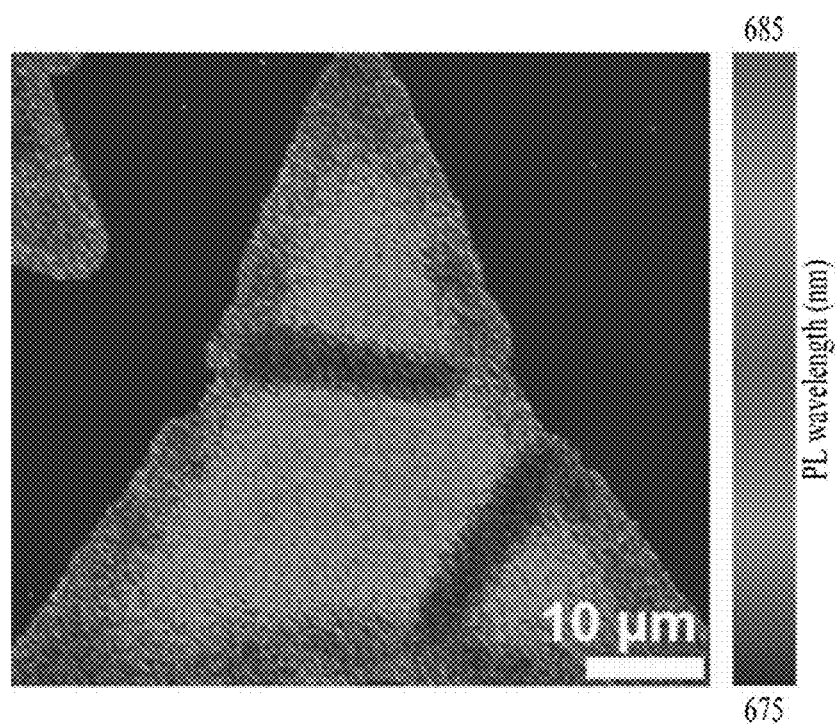

[FIG. 7C]
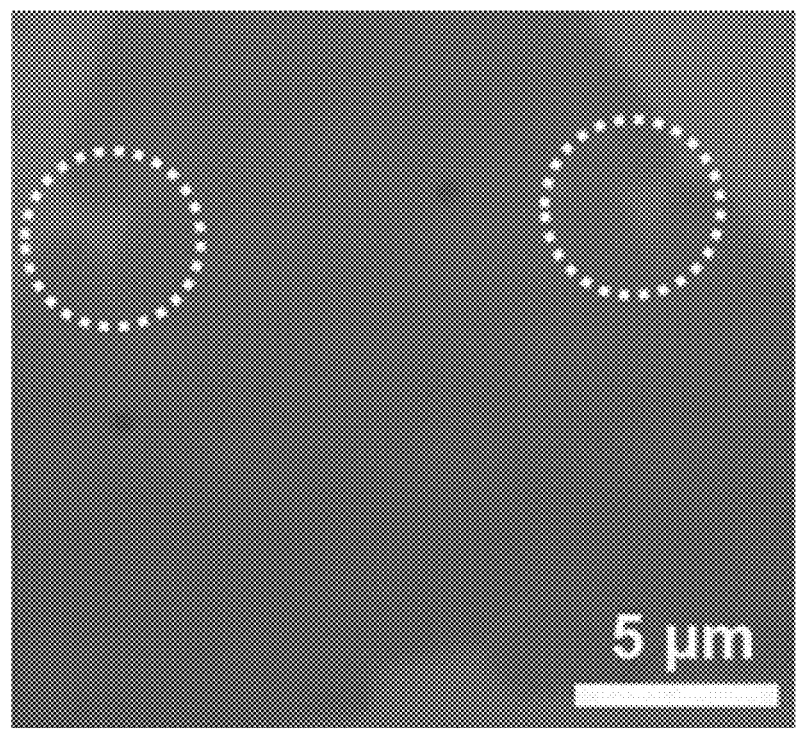

[FIG. 7D]
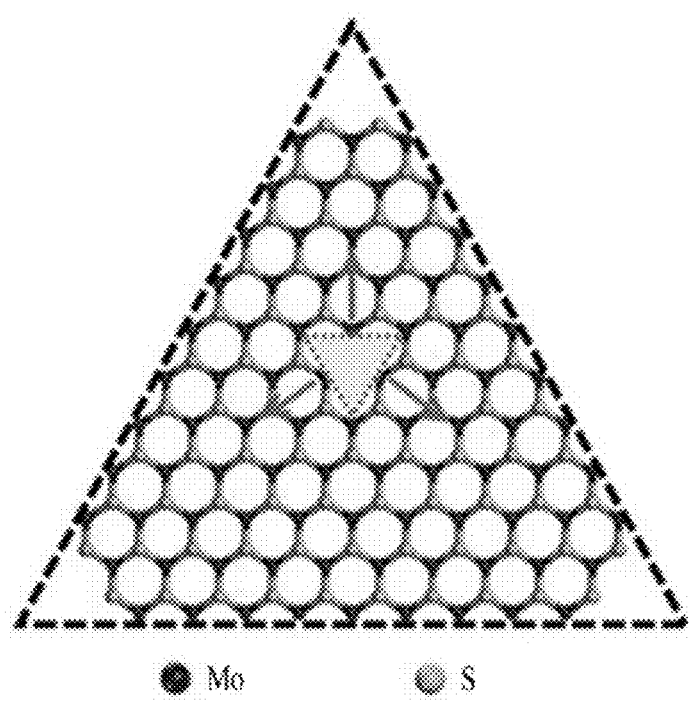

[FIG. 8]
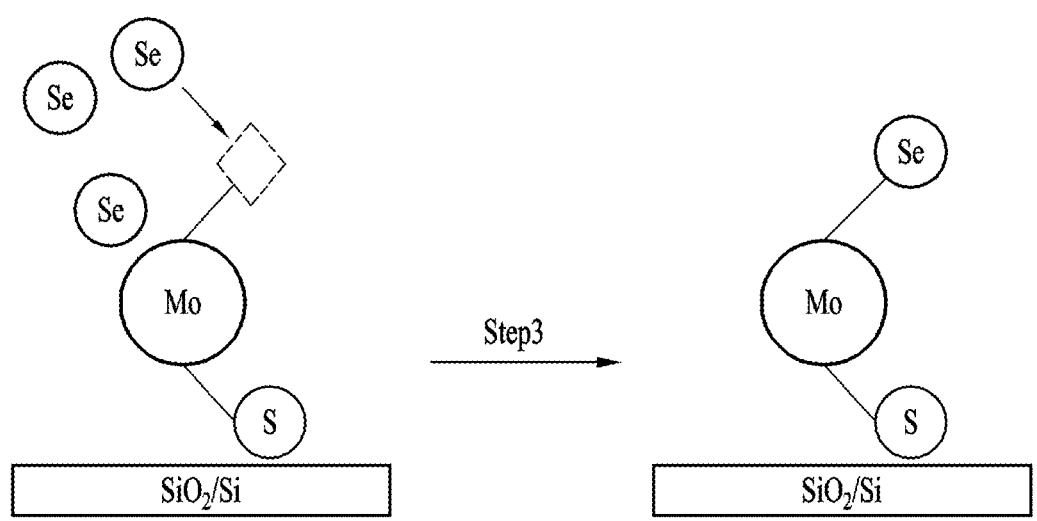

[FIG. 9A]
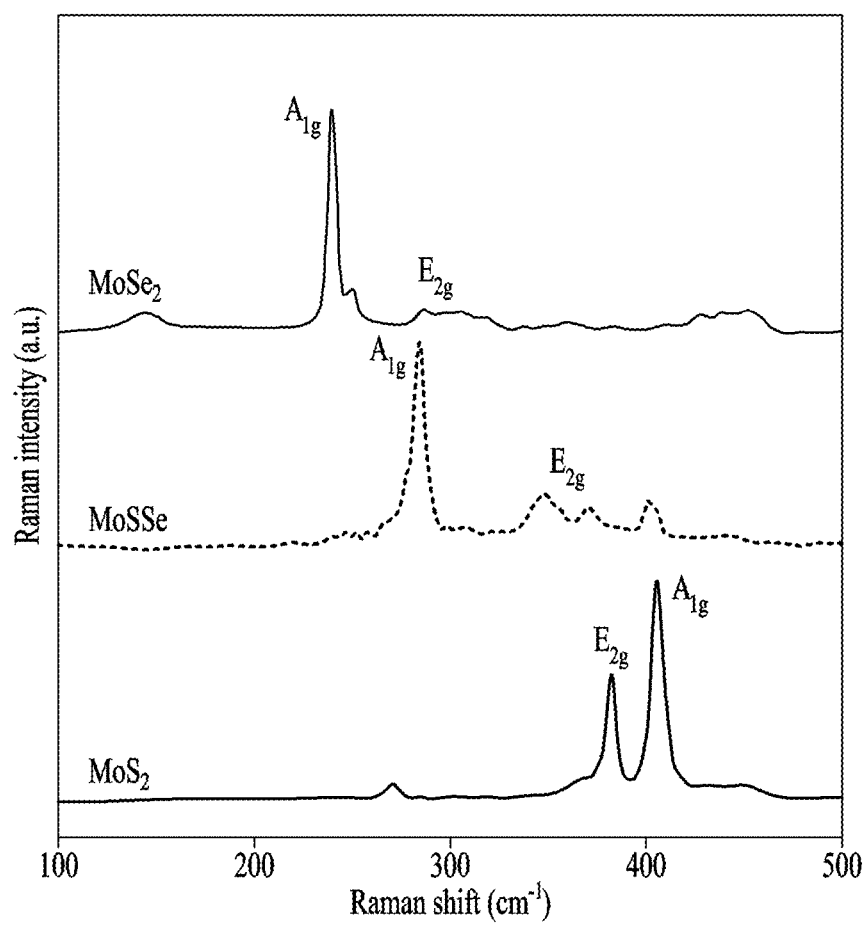

[FIG. 9B]
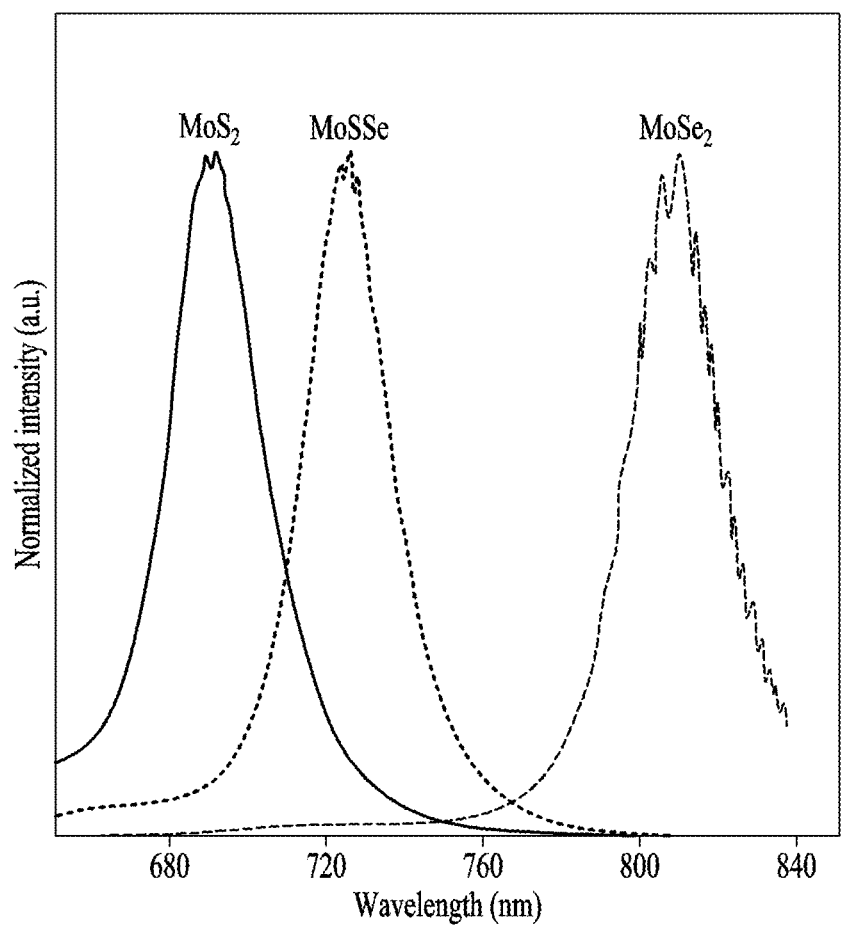

[FIG. 9C]
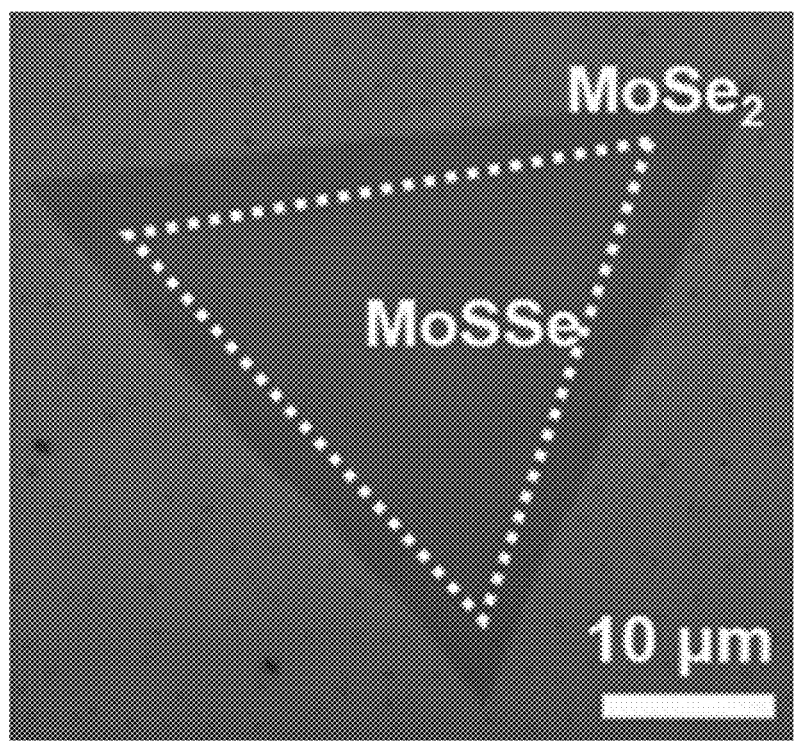

[FIG. 9D]
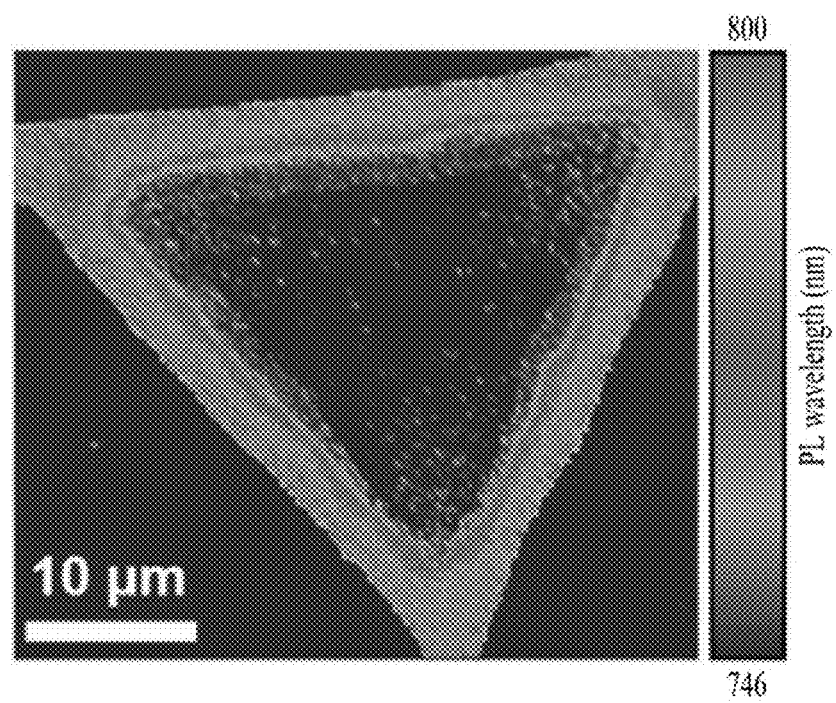

[FIG. 10A]
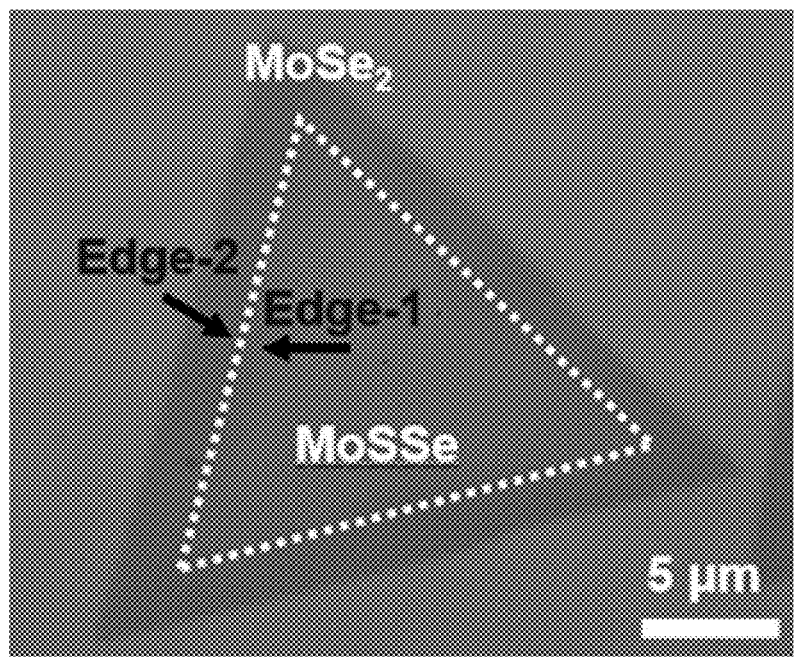

[FIG. 10B]
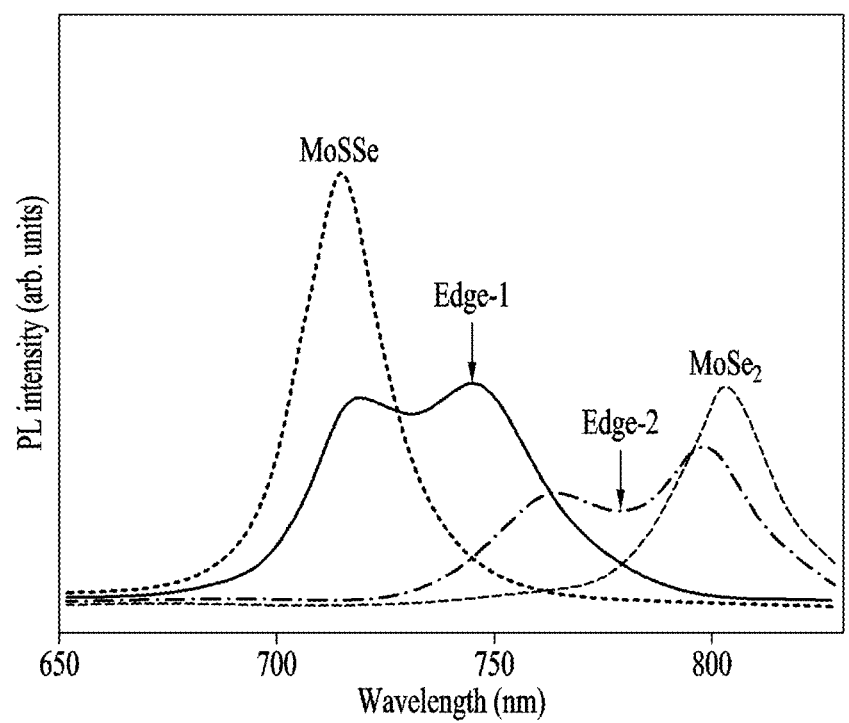

[FIG. 10C]
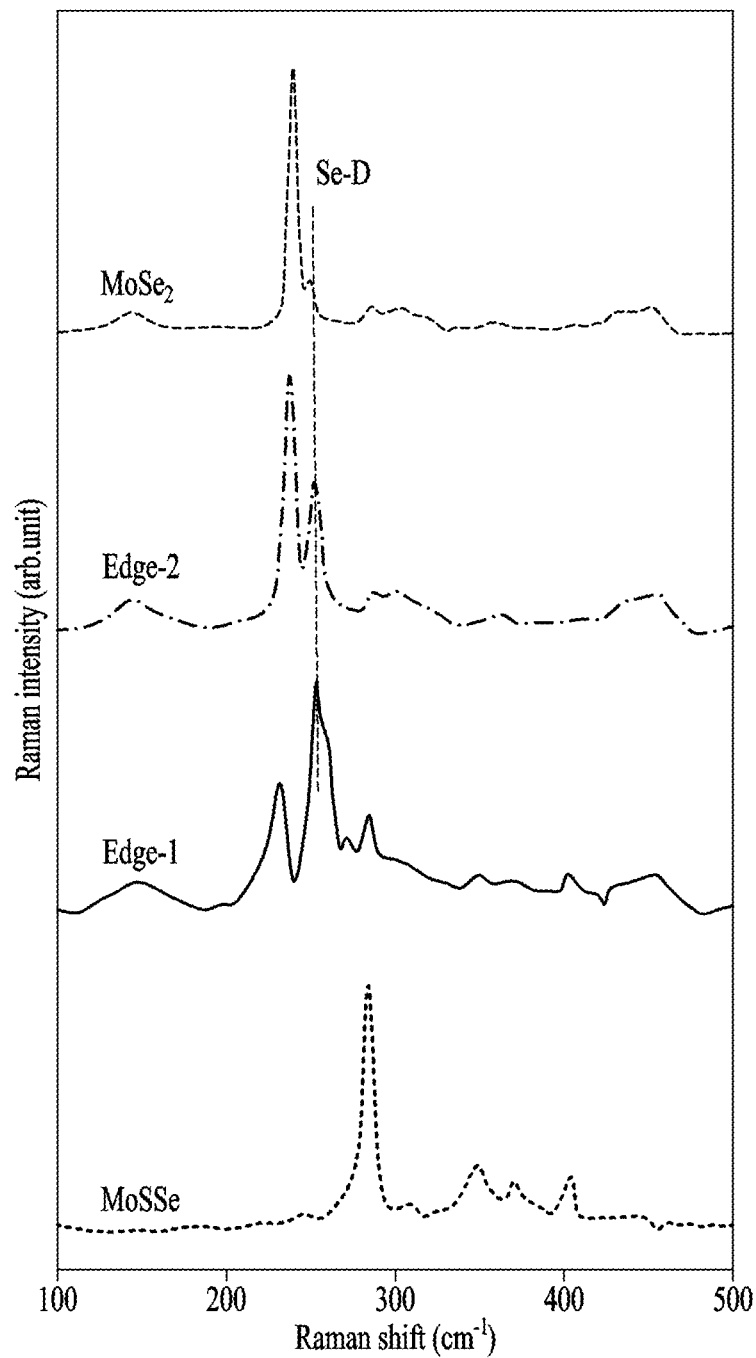

[FIG. 11A]
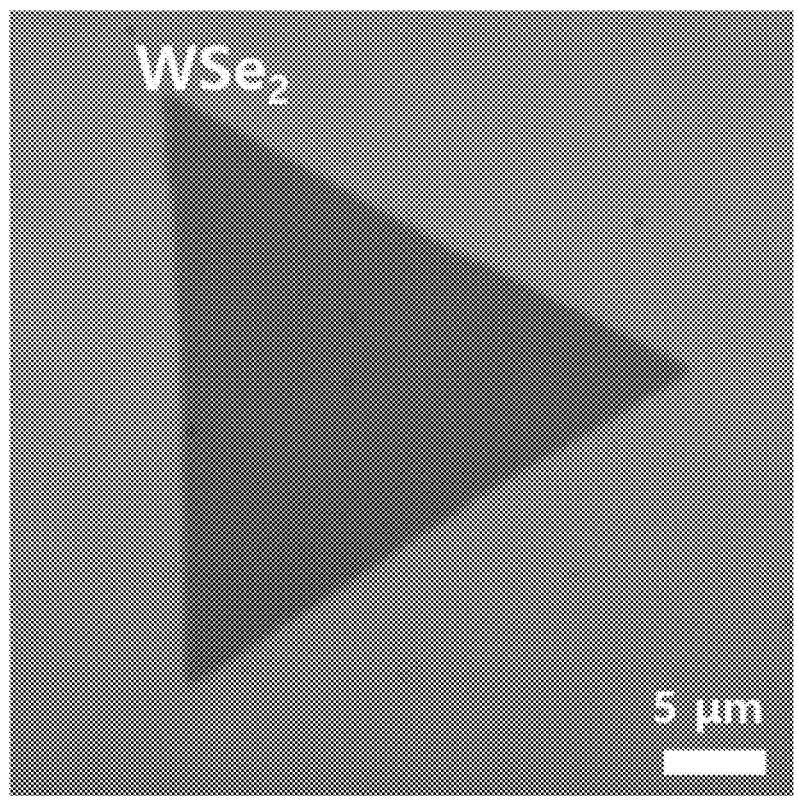

[FIG. 11B]
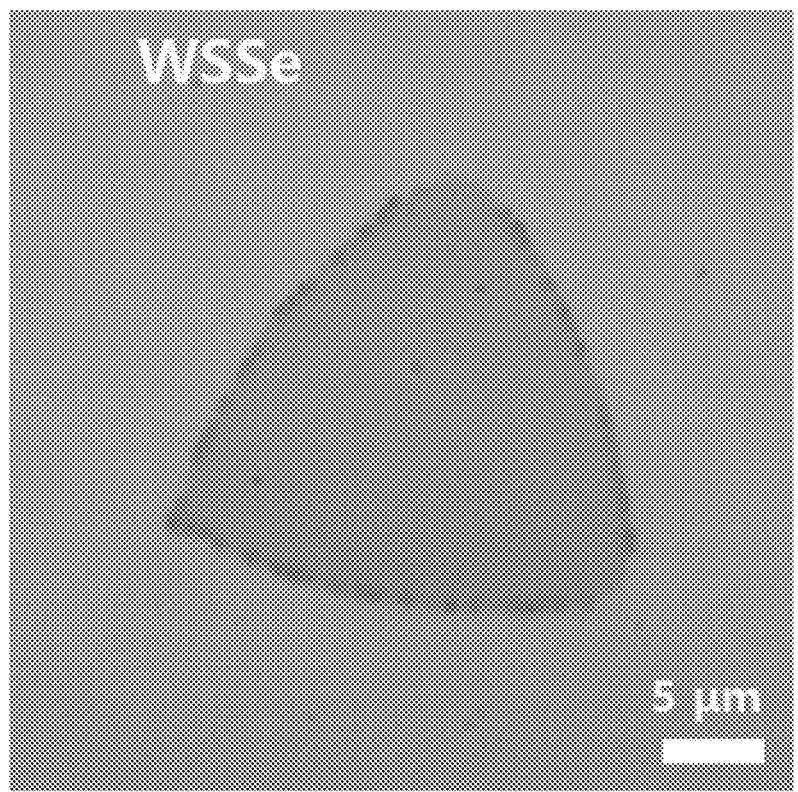

[FIG. 11C]
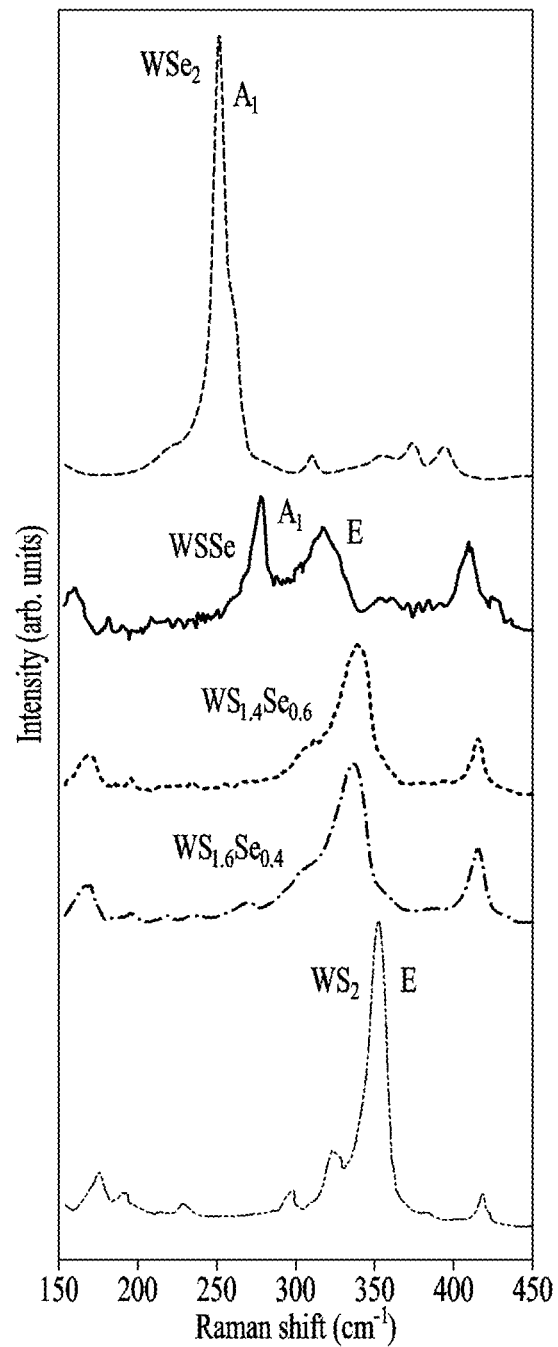

[FIG. 12A]
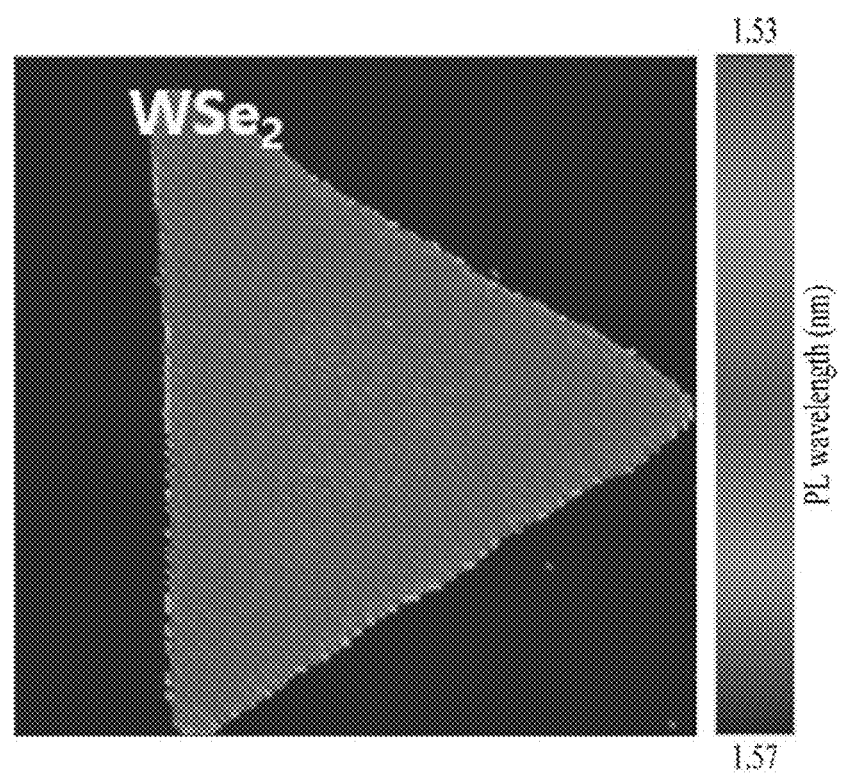

[FIG. 12B]
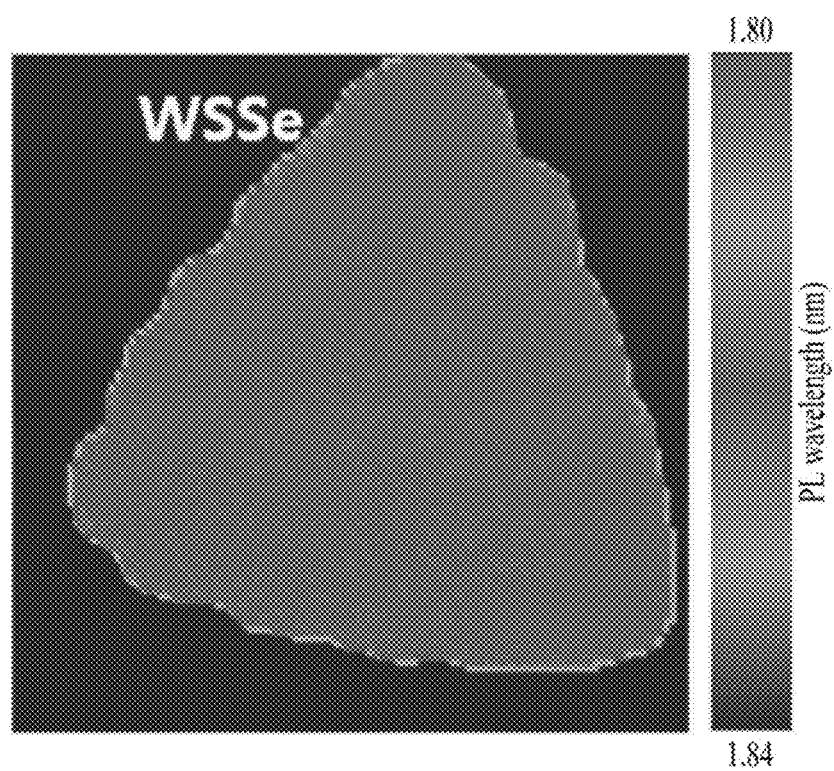

[FIG. 12C]
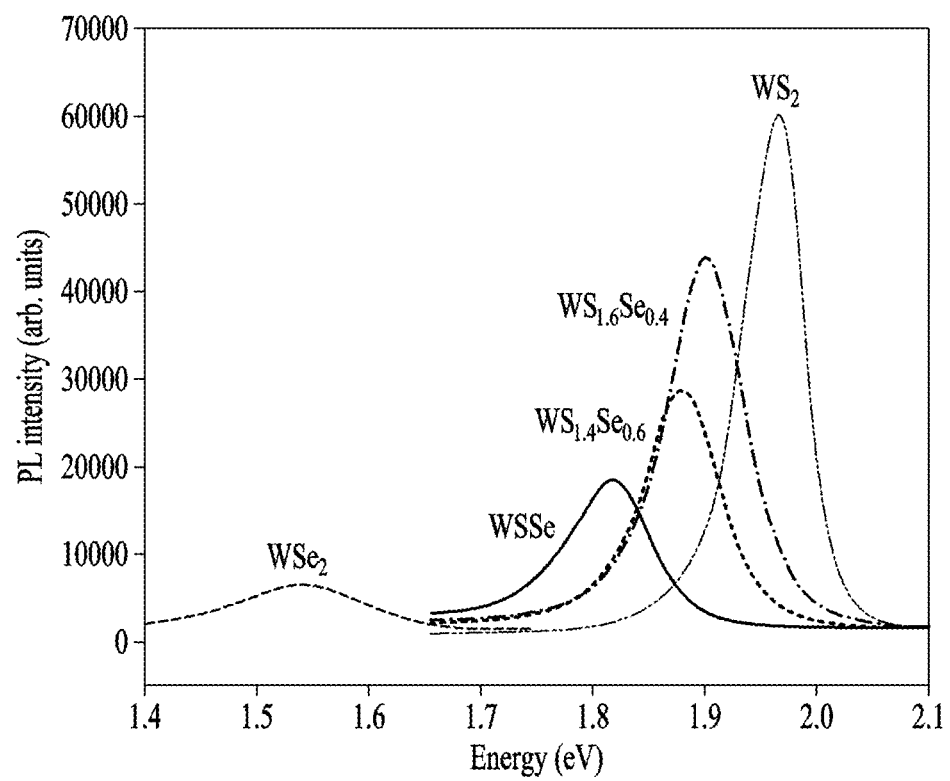

JANUS TRANSITION METAL DICHALCOGENIDE THIN FILM AND METHOD OF FABRICATING THE SAME

CROSS-REFERENCE TO RELATED APPLICATION

This application claims priority to Korean Patent Application No. 10-2021-0157774, filed on Nov. 16, 2021 in the Korean Intellectual Property Office, the disclosure of which is incorporated herein by reference.

BACKGROUND OF THE DISCLOSURE

Field of the Disclosure

The present disclosure relates to a Janus transition metal dichalcogenide thin film, and more particularly to a Janus transition metal dichalcogenide thin film fabricated by a single process and a Janus transition metal dichalcogenide thin film fabrication method including a single process.

Description of the Related Art

A two-dimensional transition metal dichalcogenide material (2-D TMDC) is a very important material in the electricity, optics, and semiconductor fields due to unique properties and excellent physical properties thereof.

In particular, the two-dimensional Janus transition metal dichalcogenide material, which is an advanced material from existing two-dimensional TMDC, exhibits various interesting quantum phenomena due to the collapse of symmetry and corresponds to a new material with many potential applications.

Janus transition metal dichalcogenides, unlike typical TMDC materials with the $MX_2$ structure which are composed of a transition metal element (M) and a chalcogen element (X), has a structure in which two different chalcogen elements (X, Y) are located in opposite layers with respect to a transition metal. Such an MXY structure is shaped like the ancient Roman god "Janus" with two faces. Since the symmetry in a vertical direction of a Janus transition metal dichalcogenide has been broken, it exhibits very unique quantum phenomena such as Rashiba spin separation, piezoelectric effect, catalytic effect, and increase in charge lifespan.

Until now, a method (first method) of previously depositing $MoS_2$ as a pre-process, and then removing S(X) in an upper part of $MoS_2(MX_2)$ with plasma using hydrogen gas as a post-process, and then substituting with Se(Y) to produce MoSSe(MXY); and a method (second method) of previously depositing $MoSe_2(MY_2)$ as a pre-process, and then substituting Se(Y) in an upper layer with S(X) by applying a high temperature of 850° C. or higher as a post-process to produce MoSSe(MXY) are only known as methods of fabricating a Janus transition metal dichalcogenide.

In both the methods, since a $MoS_2$ or $MoSe_2$ single crystal thin film is produced in a separate process by CVD, the manufacturing process is complicated, the manufacturing cost is high, the process time is long, and there is a problem in that the thin film is damaged by the damage of a single crystal due to hydrogen plasma, thermal expansion due to high heat, and the like during the process.

RELATED ART DOCUMENT

Patent Document

Korean Patent Application Publication No. 10-2017-0048873 "Method for Synthesizing Transition Metal Chalcogenide Using CVD"

SUMMARY OF THE DISCLOSURE

Therefore, the present disclosure has been made in view of the above problems, and it is an object of the present disclosure to provide a Janus transition metal dichalcogenide thin film fabricated in a single (in-situ) CVD process in one reaction chamber.

It is another object of the present disclosure to provide a method of fabricating a Janus transition metal dichalcogenide thin film performed in a single (in-situ) CVD process in one reaction chamber.

However, problems to be solved by the present invention are not limited to the above-described problems, and may be broadly extended without departing from the spirit and scope of the present invention.

In accordance with an aspect of the present invention, the above and other objects can be accomplished by the provision of a method of fabricating a Janus transition metal dichalcogenide thin film, the method including: a first step of depositing a transition metal dichalcogenide thin film including a first chalcogen element on an oxide silicon substrate; a second step of a vacancy forming in the transition metal dichalcogenide thin film; and a third step of substituting the first chalcogen element with a second chalcogen element to form a Janus transition metal dichalcogenide thin film, wherein the first step, the second step, and the third step are performed in a single CVD process in a same reaction chamber.

In an embodiment, the reaction chamber may include zone 1 and zone 2. Zone 1 may include a first chalcogen precursor and a second chalcogen precursor. Zone 2 may include a transition metal precursor. Respective heat treatment temperatures of zones 1 and zone 2 may be individually controlled.

In an embodiment, the transition metal precursor may include at least one of Mo and W. The first chalcogen precursor may include S. The second chalcogen precursor may include Se.

In an embodiment, the Janus transition metal dichalcogenide thin film may be composed of MoSSe.

In an embodiment, the Janus transition metal dichalcogenide thin film may be composed of WSSe.

In an embodiment, the transition metal precursor may further include NaCl. The melting point of a transition metal included in the transition metal precursor may be 740° C. to 760° C.

In an embodiment, in the first step, zone 1 may be thermally treated at 140° C. to 160° C. to evaporate the first chalcogen precursor, and zone 2 may be thermally treated at 740° C. to 760° C. to evaporate the transition metal precursor.

In an embodiment, the first step may include a step of injecting a carrier gas. The carrier gas may include an inert gas and a reducing gas. The inert gas may include at least one of $N_2$, He, and Ar. The reducing gas may include $H_2$.

In an embodiment, the inert gas may be injected at 80 sccm to 88 sccm. The reducing gas may be injected at 18 sccm to 22 sccm.

In an embodiment, a heat treatment temperature of zone 2 may be lowered from 740° C. to 760° C. to 570° C. to 590° C. to form the vacancy in the transition metal dichalcogenide thin film.

In an embodiment, in the third step, zone 1 may be thermally treated at 290° C. to 310° C. to evaporate the second chalcogen precursor, and the vacancy may be filled with the second chalcogen element to substitute the first chalcogen element with the second chalcogen element. In accordance with another aspect of the present invention, there is provided a Janus transition metal dichalcogenide thin film, including a Janus transition metal dichalcogenide, the Janus transition metal dichalcogenide including a transition metal, a first chalcogen element, and a second chalcogen element, the Janus transition metal dichalcogenide thin film is fabricated by a method including: a first step of depositing a transition metal dichalcogenide thin film including a first chalcogen element on an oxide silicon substrate; a second step of a vacancy forming in the transition metal dichalcogenide thin film; and a third step of substituting the first chalcogen element with a second chalcogen element to form a Janus transition metal dichalcogenide thin film, wherein the first step, the second step, and the third step are performed in a single CVD process in a same reaction chamber.

BRIEF DESCRIPTION OF THE DRAWINGS

The above and other objects, features and other advantages of the present disclosure will be more clearly understood from the following detailed description taken in conjunction with the accompanying drawings, in which:

FIG. 1 illustrates a single CVD process of fabricating a Janus transition metal dichalcogenide thin film according to an embodiment of the present disclosure;

FIG. 2 illustrates a flowchart of a fabrication method of a Janus transition metal dichalcogenide thin film;

FIG. 3 illustrates time-dependent temperature changes in zones 1 and 2 included in a reaction chamber;

FIG. 4 illustrates a first step of the single CVD process of FIG. 1;

FIG. 5 illustrates a transition metal dichalcogenide thin film formed by the first step of FIG. 4;

FIG. 6 illustrates a second step of the single CVD process of FIG. 1;

FIGS. 7A-7D illustrate a vacancy, which is formed by the second step of FIG. 6, in a transition metal dichalcogenide thin film;

FIG. 8 illustrates a third step of the single CVD process of FIG. 1;

FIGS. 9A-9D illustrate a Janus transition metal dichalcogenide thin film formed by the third step of FIG. 8;

FIGS. 10A-10C illustrate a material composition of a boundary portion of the Janus transition metal dichalcogenide thin film;

FIGS. 11A-11C illustrate a Janus transition metal dichalcogenide thin film according to another embodiment; and FIGS. 12A-12C illustrate a material composition of the Janus transition metal dichalcogenide thin film of FIGS. 11A-11C.

DETAILED DESCRIPTION OF THE DISCLOSURE

Specific structural and functional descriptions of embodiments according to the concept of the present disclosure disclosed herein are merely illustrative for the purpose of explaining the embodiments according to the concept of the present disclosure. Furthermore, the embodiments according to the concept of the present disclosure can be implemented in various forms and the present disclosure is not limited to the embodiments described herein.

The embodiments according to the concept of the present disclosure may be implemented in various forms as various modifications may be made. The embodiments will be described in detail herein with reference to the drawings. However, it should be understood that the present disclosure is not limited to the embodiments according to the concept of the present disclosure, but includes changes, equivalents, or alternatives falling within the spirit and scope of the present disclosure.

The terms such as "first" and "second" are used herein merely to describe a variety of constituent elements, but the constituent elements are not limited by the terms. The terms are used only for the purpose of distinguishing one constituent element from another constituent element. For example, a first element may be termed a second element and a second element may be termed a first element without departing from the scope of rights according to the concept of the present invention.

It will be understood that when an element is referred to as being "on", "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Other words used to describe the relationship between elements should be interpreted in a like fashion (e.g., "between," versus "directly between," "adjacent," versus "directly adjacent," etc.).

The terms used in the present specification are used to explain a specific exemplary embodiment and not to limit the present inventive concept. Thus, the expression of singularity in the present specification includes the expression of plurality unless clearly specified otherwise in context. Also, terms such as "include" or "comprise" in the specification should be construed as denoting that a certain characteristic, number, step, operation, constituent element, component or a combination thereof exists and not as excluding the existence of or a possibility of an addition of one or more other characteristics, numbers, steps, operations, constituent elements, components or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present disclosure will now be described more fully with reference to the accompanying drawings, in which exemplary embodiments of the invention are shown. This disclosure may, however, be embodied in many different forms and should not be construed as limited to the exemplary embodiments set forth herein. Like reference numerals in the drawings denote like elements.

FIG. 1 illustrates a single CVD process of fabricating a Janus transition metal dichalcogenide thin film according to an embodiment of the present disclosure, FIG. 2 illustrates a flowchart of a fabrication method of a Janus transition metal dichalcogenide thin film, and FIG. 3 illustrates time-dependent temperature changes in zones 1 and 2 included in a reaction chamber.

The Janus transition metal dichalcogenide thin film of the present disclosure may include a Janus transition metal dichalcogenide. The Janus transition metal dichalcogenide material may include a transition metal, a first chalcogen element, and a second chalcogen element.

For example, Janus transition metal dichalcogenides, unlike typical TMDC materials with the $MX_2$ structure which are composed of a transition metal element (M) and a chalcogen element (X), has an MXY structure in which two different chalcogen elements (X, Y) are located in opposite layers with respect to a transition metal.

Referring to FIGS. 1 and 2, the Janus transition metal dichalcogenide thin film according to an embodiment of the present disclosure may be fabricated through a first step (S100) of depositing a transition metal dichalcogenide thin film including a first chalcogen element on an oxide silicon substrate, a second step (S200) of forming a vacancy in the transition metal dichalcogenide thin film, and a third step (S300) of substituting the first chalcogen element with the second chalcogen element to form a Janus transition metal dichalcogenide thin film.

The first step (S100), the second step (S200), and the third step (S300) may be performed in a single CVD process in the same reaction chamber.

The oxide silicon thin film may be an n-type $SiO_2$/Si thin film having a thickness of 300 nm.

The reaction chamber may include zones 1 and 2. For example, a distance between zone 1 and zone 2 in the reaction chamber may be 11 cm to 17 cm.

Zone 1 may include a first chalcogen precursor and a second chalcogen precursor. The first chalcogen precursor and the second chalcogen precursor may include a chalcogen element.

For example, the first chalcogen precursor may include S, and the second chalcogen precursor may include Se. That is, in embodiments of the present disclosure, the first chalcogen element may be S, and the second chalcogen element may be Se.

Zone 2 may include a transition metal precursor. A transition metal included in the transition metal precursor may include at least one of Sc, Ti, V, Cr, Mn, Fe, Co, Ni, Nb, Mo and W.

In embodiments of the present disclosure, the transition metal may be any one of Mo and W.

For example, the Janus transition metal dichalcogenide thin film may include MoSSe. For example, a Janus transition metal dichalcogenide thin film may include WSSe.

When the transition metal is Mo, the transition metal may be present in the form of $MoO_3$ powder in the transition metal precursor.

The transition metal precursor may further include NaCl. When NaCl is included in the transition metal precursor, the melting point of the transition metal may be lowered. For example, when the transition metal precursor is included in NaCl, the melting point of Mo may be lowered to 740° C. to 760° C.

Referring to FIG. 3, a heat treatment temperature of each of zones 1 and 2 inside the reaction chamber may be individually controlled by the fabrication method of a Janus transition metal dichalcogenide according to embodiments of the present disclosure.

For example, heat treatment temperatures of zones 1 and 2 in the first, second, third steps may be different from each other.

By individually controlling the heat treatment temperatures of zones 1 and 2 in each of the process steps, a transition metal dichalcogenide thin film may be formed by a single CVD process in the same reaction chamber, a vacancy may be formed in the transition metal dichalcogenide thin film, and the first chalcogen element may be substituted with the second chalcogen element.

Now, the first, second, and third steps of the Janus transition metal dichalcogenide thin film fabrication process are described in detail with reference to FIGS. 4 to 12C.

FIG. 4 illustrates the first step of the single CVD process of FIG. 1, and FIG. 5 illustrates a transition metal dichalcogenide thin film formed by the first step of FIG. 4.

In an embodiment, the transition metal may be Mo. For example, the Janus transition metal dichalcogenide thin film may be composed of MoSSe.

The Janus transition metal dichalcogenide thin film according to an embodiment of the present disclosure may be fabricated by the first step (S100) of depositing a transition metal dichalcogenide thin film including a first chalcogen element on an oxide silicon substrate.

In an embodiment, the first step may include a step of injecting a carrier gas. The carrier gas may include an inert gas and a reducing gas.

For example, the inert gas may include at least one of $N_2$, He, and Ar. For example, the reducing gas may include $H_2$.

In the first step, the reaction chamber may be purged with 80 sccm to 88 sccm of the inert gas. For example, the reaction chamber may be purged with 82 sccm of Ar gas.

In the first step, the reaction chamber may be purged with 18 sccm to 22 sccm of the reducing gas. For example, the reaction chamber may be purged with 20 sccm of $H_2$ gas.

In an embodiment, in the first step, zone 1 may be thermally treated at 140° C. to 160° C. and zone 2 may be thermally treated at 740° C. to 760° C., thereby forming the transition metal dichalcogenide thin film.

For example, the first chalcogen precursor may be evaporated by thermally treating zone 1 at 150° C.

For example, the transition metal precursor may be evaporated by thermally treating zone 2 at 750° C.

In the first step, the heat treatment temperature (e.g., 150° C.) of zone 1 and the heat treatment temperature (e.g., 750° C.) of zone 2 may be respectively maintained for 10 minutes.

During this time, the evaporated transition metal precursor may react with the evaporated first chalcogen precursor due to the action of the carrier gas to form a transition metal dichalcogenide thin film.

In an embodiment, the transition metal dichalcogenide thin film may be configured as a triple-layer to be optimized for a single CVD process.

For example, in the first step, S may be evaporated by thermally treating zone 1 at 150° C., Mo may be evaporated by thermally treating zone 2 at 750° C., and Mo may react with S in Ar and $H_2$ gas atmosphere, thereby forming a $MoS_2$ thin film.

As shown in the KPFM image and surface potential profile (SP) of FIG. 5, it can be confirmed that a transition metal dichalcogenide (e.g., $MoS_2$) is synthesized in the first step.

In particular, referring to the surface potential profile, it can be seen that a uniform transition metal dichalcogenide thin film is formed in a crystalline region because a surface potential of an inner substrate region of the crystalline region is significantly different from a surface potential of an outer substrate region thereof.

FIG. 6 illustrates the second step of the single CVD process of FIG. 1, and FIGS. 7A-7D illustrates a vacancy, which is formed by the second step of FIG. 6, in a transition metal dichalcogenide thin film.

The Janus transition metal dichalcogenide thin film according to an embodiment of the present disclosure may be fabricated by the second step (S200) of forming a vacancy in the transition metal dichalcogenide thin film.

In an embodiment, in the second step, the heat treatment temperature of zone 2 may be lowered from 740° C. to 760° C. to 570° C. to 590° C. so that the vacancy is formed in the transition metal dichalcogenide thin film.

The temperature of 570° C. to 590° C. may be a growth temperature of the Janus transition metal dichalcogenide thin film.

For example, in the second step, the heat treatment temperature of zone 2 maintained at 750° C. according to the first step may be lowered to 580° C.

In the second step, the heat treatment temperature (e.g., 580° C.) of zone 2 may be maintained for 10 minutes.

During this time, a vacancy may be formed in the transition metal dichalcogenide thin film. For example, as shown in FIG. 6, S vacancy may be formed as some of bonds between Mo and S in the $MoS_2$ thin film are broken.

Referring to FIGS. 7A-7D, FIG. 7A illustrates an optical image of the second step, FIG. 7B illustrates a PL mapping image for the optical image in FIG. 7A, and FIG. 7C illustrates an enlarged image of a vacancy in the optical image in FIG. 7A. In addition, FIG. 7D an image schematically showing S vacancy formation.

As shown in FIGS. 7B and 7C, it can be confirmed that a space in which a chalcogen atom is absent in a specific part is formed in the second step. Accordingly, it can be seed that S vacancy is formed as some of bonds of Mo and S are broken as shown in the schematic diagram of FIG. 7D in the second step.

FIG. 8 illustrates the third step of the single CVD process of FIG. 1, FIGS. 9A-9D illustrate a Janus transition metal dichalcogenide thin film formed by the third step of FIG. 8, and FIGS. 10A-10C illustrate a material composition of a boundary portion of the Janus transition metal dichalcogenide thin film.

The Janus transition metal dichalcogenide thin film according to an embodiment of the present disclosure may be fabricated by the third step (S300) of substituting the first chalcogen element with the second chalcogen element to form a Janus transition metal dichalcogenide thin film.

In an embodiment, in the third step, the second chalcogen precursor may be evaporated by thermally treating zone 1 at 290° C. to 310° C. When the second chalcogen precursor is evaporated, the vacancy formed in the second step may be filled with the second chalcogen element.

As the vacancy is filled with the second chalcogen element in the third step, the first chalcogen element in the transition metal dichalcogenide thin film may be substituted with the second chalcogen element. When the first chalcogen element is substituted with the second chalcogen element, a Janus transition metal dichalcogenide thin film maybe formed.

For example, in the third step, Se may be evaporated by thermally treating zone 1 at 300° C., and the S vacancy formed in the second step may be filled with the evaporated Se, thereby forming a MoSSe thin film.

FIGS. 9A-9D illustrate a Raman spectrum and PL spectrum of the Janus transition metal dichalcogenide. In particular, it can be confirmed that a MoSSe thin film is formed according to the Raman spectrum of an inner region with respect to the boundary portion, as shown in FIG. 9D.

FIGS. 10A-10C illustrate a Raman spectrum and PL spectrum of a boundary portion of the Janus transition metal dichalcogenide thin film. As shown in FIGS. 10B and 10C, it can be confirmed that a thin film in which MoSSe is mixed with $MoSe_2$ is formed at the boundary portion.

In particular, it can be seen that a ratio of $MoSe_2$ increases from an inner first boundary portion (Edge-1) to an outer second boundary portion (Edge-2).

Such a boundary structure may be formed because S is excessively substituted with Se as it moves away from the center of the Janus transition metal dichalcogenide thin film.

FIGS. 11A-11C illustrate a Janus transition metal dichalcogenide thin film according to another embodiment, and FIGS. 12A-12C illustrate a material composition of the Janus transition metal dichalcogenide thin film of FIGS. 11A-11C.

In an embodiment, the transition metal may be W. For example, the Janus transition metal dichalcogenide thin film may be composed of WSSe.

Referring to FIGS. 11A-11C, an optical image and Raman spectrum of the Janus transition metal dichalcogenide thin film are illustrated.

Specifically, FIG. 11A illustrates an optical image of $WSe_2$, FIG. 11B illustrates an optical image of WSSe, and FIG. 11C illustrates a Raman spectrum according to respective compositions.

Referring to FIG. 11C, it can be confirmed that peak values on the Raman spectrum according to the composition ratios of S and Se are significantly different.

For example, it can be confirmed that when the Janus transition metal dichalcogenide thin film is composed of WSSe, a peak value of $WS_2$ component is not detected in the Raman spectrum of WSSe.

Accordingly, it can be seen that $WS_2$ is hardly present in a lower layer of the Janus transition metal dichalcogenide thin film.

Referring to FIGS. 12A-12C, PL mapping images and PL spectra for the optical images of FIGS. 11A-11C are shown.

Referring to FIG. 12B, it can be confirmed that when composed of WSSe, the uniformity of WSSe in the Janus transition metal dichalcogenide thin film is very high.

For example, when the Janus transition metal dichalcogenide thin film is composed of WSSe, $WSe_2$ or $WS_2$ may hardly be formed in the lower layer of the Janus transition metal dichalcogenide thin film.

That is, it can be seen that a uniform WSSe thin film is formed by the Janus transition metal dichalcogenide thin film fabrication method according to an embodiment of the present disclosure.

As such, the method of fabricating a Janus transition metal dichalcogenide thin film fabrication method according to an embodiment of the present disclosure is performed at a high heat treatment temperature, and, unlike existing methods of fabricating a Janus transition metal dichalcogenide thin film requiring several process steps, is performed in a single CVD process, which simplifies a fabrication process.

Therefore, the method of fabricating a Janus transition metal dichalcogenide thin film according to the present disclosure can shorten the processing time of a Janus transition metal dichalcogenide thin film and reduce the manufacturing cost thereof. In addition, the method of fabricating a Janus transition metal dichalcogenide thin film can minimize damage to the Janus transition metal dichalcogenide thin film during the fabrication process, thereby being capable of a high-quality single-crystal Janus transition metal dichalcogenide thin film.

As apparent from the above description, a method of fabricating a Janus transition metal dichalcogenide thin film according to an embodiment of the present disclosure can be performed at a high heat treatment temperature, and, unlike existing methods of fabricating a Janus transition metal dichalcogenide thin film requiring several process steps, can be performed in a single CVD process, which can simplify a fabrication process.

Therefore, the method of fabricating a Janus transition metal dichalcogenide thin film according to the present disclosure can shorten the processing time of a Janus transition metal dichalcogenide thin film and reduce the manufacturing cost thereof.

In addition, the method of fabricating a Janus transition metal dichalcogenide thin film can minimize damage to the Janus transition metal dichalcogenide thin film during the fabrication process, thereby being capable of a high-quality single-crystal Janus transition metal dichalcogenide thin film.

However, the effects of the present invention are not limited to the above-described effects, and may be broadly extended without departing from the spirit and scope of the present invention.

Although the present invention has been described with reference to limited embodiments and drawings, it should be understood by those skilled in the art that various changes and modifications may be made therein. For example, the described techniques may be performed in a different order than the described methods, and/or components of the described apparatuses, structures, devices, circuits, etc., may be combined in a manner that is different from the described method, or appropriate results may be achieved even if replaced by other components or equivalents. Therefore, other embodiments, other examples, and equivalents to the claims are within the scope of the following claims.

DESCRIPTION OF SYMBOLS

S100: first step of depositing transition metal dichalcogenide thin film
S200: second step of forming vacancy in transition metal dichalcogenide thin film
S300: third step of forming Janus transition metal dichalcogenide thin film

What is claimed is:

1. A method of fabricating a Janus transition metal dichalcogenide thin film, the method comprising:
a first step of depositing a transition metal dichalcogenide thin film comprising a first chalcogen element on an oxide silicon substrate;
a second step of a vacancy forming in the transition metal dichalcogenide thin film; and
a third step of substituting the first chalcogen element with a second chalcogen element to form a Janus transition metal dichalcogenide thin film,
wherein the first step comprises injecting a carrier gas including an inert gas and a reducing gas into a reaction chamber including a first zone and a second zone,
wherein the first zone contains a first chalcogen precursor and a second chalcogen precursor, and the second zone contains a transition metal precursor,
wherein respective heat treatment temperatures of the first zone and the second zone are individually controlled according to melting points of the precursors contained therein,
and the first chalcogen precursor and the transition metal precursor are evaporated to deposit the transition metal dichalcogenide thin film on the oxide silicon substrate,
wherein in the second step, the second zone is cooled to a growth temperature of the Janus transition metal dichalcogenide thin film to form the vacancy in the transition metal dichalcogenide thin film, and
wherein the first step, the second step, and the third step are performed in a single CVD process in a same reaction chamber.

2. The method according to claim 1, wherein the transition metal precursor comprises at least one of Mo and W,
the first chalcogen precursor comprises S, and
the second chalcogen precursor comprises Se.

3. The method according to claim 2, wherein the Janus transition metal dichalcogenide thin film is composed of MoSSe.

4. The method according to claim 2, wherein the Janus transition metal dichalcogenide thin film is composed of WSSe.

5. The method according to claim 2, wherein the transition metal precursor further comprises NaCl, and
a melting point of a transition metal comprised in the transition metal precursor is 740° C. to 760° C.

6. The method according to claim 1, wherein in the first step,
the first zone is thermally treated at 140° C. to 160° C. to evaporate the first chalcogen precursor, and
the second zone is thermally treated at 740° C. to 760° C. to evaporate the transition metal precursor.

7. The method according to claim 1, wherein the first step comprises injecting a carrier gas,
the carrier gas comprising an inert gas and a reducing gas,
the inert gas comprising at least one of $N_2$, He, and Ar, and
the reducing gas comprising $H_2$.

8. The method according to claim 7, wherein the inert gas is injected at 80 sccm to 88 sccm, and
the reducing gas is injected at 18 sccm to 22 sccm.

9. The method according to claim 1, wherein in the second step, a heat treatment temperature of the second zone is lowered from 740° C. to 760° C. to 570° C. to 590° C. to form the vacancy in the transition metal dichalcogenide thin film.

10. The method according to claim 1, wherein in the third step,
the first zone is thermally treated at 290° C. to 310° C. to evaporate the second chalcogen precursor, and
the vacancy is filled with the second chalcogen element to substitute the first chalcogen element with the second chalcogen element.

* * * * *